United States Patent
Tsai

(10) Patent No.: US 7,486,756 B2
(45) Date of Patent: Feb. 3, 2009

(54) PHASE DETECTOR

(75) Inventor: Leif Tsai, Taipei (TW)

(73) Assignee: Via Technologies, Inc., Taipei (TW)

( * ) Notice: Subject to any disclaimer, the term of this patent is extended or adjusted under 35 U.S.C. 154(b) by 605 days.

(21) Appl. No.: 11/005,792

(22) Filed: Dec. 7, 2004

(65) Prior Publication Data
US 2005/0146359 A1 Jul. 7, 2005

(30) Foreign Application Priority Data
Jan. 7, 2004 (TW) .............................. 93100390 A

(51) Int. Cl.
*H04L 7/00* (2006.01)
(52) U.S. Cl. .................. 375/371; 375/355; 375/373; 375/375; 375/376; 327/525
(58) Field of Classification Search ................. 375/215, 375/226, 354, 362, 371, 373, 376, 355, 375; 327/155–157
See application file for complete search history.

(56) References Cited

U.S. PATENT DOCUMENTS

| | | | | |
|---|---|---|---|---|
| 6,256,362 B1* | 7/2001 | Goldman | .................. | 375/373 |
| 6,392,456 B1* | 5/2002 | Pyeon et al. | ................. | 327/156 |
| 6,438,178 B1* | 8/2002 | Lysdal et al. | ................. | 375/317 |
| 6,735,731 B2* | 5/2004 | Ewen et al. | .................. | 714/733 |
| 2001/0055355 A1* | 12/2001 | Okamoto | ..................... | 375/355 |
| 2004/0146131 A1* | 7/2004 | Wilson | ........................ | 375/375 |
| 2004/0247066 A1* | 12/2004 | Suda | ........................... | 375/376 |
| 2004/0257118 A1* | 12/2004 | Galloway et al. | ............... | 327/2 |

* cited by examiner

*Primary Examiner*—Shuwang Liu
*Assistant Examiner*—Hirdepal Singh
(74) *Attorney, Agent, or Firm*—Thomas, Kayden, Horstemeyer & Risley

(57) ABSTRACT

A phase detector is applied for detecting the phase difference between a data signal and a clock signal, and outputting a first up signal whose pulse width is between 1/2 and 3/2 period of the clock signal, a first down signal, a second down signal, and a second up signal whose periods are equal to the period of the clock signal to a charge pump. The pulse width of the first up signal varies with the difference between the falling edge of the clock signal and the data signal. Besides, the falling edge of the first up signal of the invention is aligned to the falling edge of the clock signal, and is unrelated to the pulse of the data signal. The invention utilizes the up signal and down signal which are more accurate to resolve the unlock problem due to the divergence of the phase error signal.

8 Claims, 10 Drawing Sheets

PHASE DETECTOR

This application claims the benefit of Taiwan application Ser. No. 93100390, filed Jan. 7, 2004, the subject matter of which is incorporated herein by reference.

BACKGROUND OF THE INVENTION

1. Field of the Invention

The invention relates in general to a phase detector, and more particularly to a phase detector applied in a phase-lock loop clock recovery system.

2. Description of the Related Art

For ordinary synchronous transmission of digital signal, data signal is transmitted to a receiving unit in a fixed rate of transmission by a transmitting unit. Normally, the receiving unit uses a phase-lock loop clock recovery system to detect the phase difference between the received data signal and the clock signal of the receiving unit and demodulate the phase and frequency of the clock signal of the receiving unit. Thus, the clock signal of the receiving unit will have same phase and frequency with the received data signal, facilitating the receiving unit to perform sampling and demodulation on the data signal.

Referring to FIG. 1, a block diagram of a conventional phase-lock loop clock recovery system is shown. Conventional phase-lock loop clock recovery system 100 comprises a phase detector 102, a charge pump 104, a loop filter 106 and a voltage controlled oscillator (VCO) 108. The phase detector 102 is for detecting the phase difference between a data signal DT and a clock signal CLK, and outputting a first up signal UP1, a first down signal DN2 and a second down signal DN3 and a second up signal UP4 to charge pump 104 correspondingly. The charge pump 104 correspondingly outputs a phase error signal PE to the loop filter 106, wherein the phase error signal PE corresponds to the phase difference between the data signal DT and the clock signal CLK. The loop filter 106 low-pass filters the phase error signal PE and generates an output signal LFO. The VCO 108 demodulates the frequency and phase of the outputted clock signal CLK according to the voltage level of signal LFO, so that the clock signal CLK can have the same phase and frequency with that of the data signal DT. Of which, when the first up signal UP1 or the second up signal UP4 is enabled, the voltage of the phase error signal PE will rise up; when the first down signal DN2 or the second down signal DN3 is enabled, the voltage of the phase error signal PE will fall down.

Referring to FIG. 2, a detailed circuit diagram of a conventional phase detector 102a is shown. The phase detector 102 comprises a first D-type latch 202, a second D-type latch 204, a third D-type latch 206, a fourth D-type latch 208, a fifth D-type latch 210, a first Exclusive-OR gate (XOR gate) 212, a second XOR gate 214, a third XOR gate 216 and a fourth XOR gate 218.

The input end D1 of the first D-type latch 202 is for receiving the data signal DT. When the clock signal CLK is at a low level, the data signal DT is transmitted to the output end Q1 of the first D-type latch 202. The input end D2 of the second D-type latch 204 is for receiving the output signal of the first D-type latch 202. When the clock signal CLK is at a high level, the output signal of the first D-type latch 202 is transmitted to the output end Q2 of the second D-type latch 204. The input end D3 of the third D-type latch 206 is for receiving the output signal of the second D-type latch 204. When the clock signal CLK is at a low level, the output signal of the second D-type latch 204 is transmitted to the output end Q3 of the third D-type latch 206. The input end D4 of the fourth D-type latch 208 is for receiving the output signal of the third D-type latch 206. When the clock signal CLK is at a high level, the output signal of the third D-type latch 206 is transmitted to the output end Q4 of the fourth D-type latch 208. The input end D5 of the fifth D-type latch 210 is for receiving the output signal of the D-type latch 208. When the clock signal CLK is at a high level, the output signal of the fourth D-type latch 208 is transmitted to the output end Q5 of the fifth D-type latch 210.

The first XOR gate 212 generates a first up signal UP1 according to the data signal DT and the output signal of the second D-type latch 204. The second XOR gate 214 generates a first down signal DN2 according to the output signal of the second D-type latch 204 and the output signal of the third D-type latch 206. The third XOR gate 216 generates a second down signal DN3 according to the output signal of the third D-type latch 206 and the output signal of the fourth D-type latch 208. The fourth XOR gate 218 generates a second up signal UP4 according to the output signal of the fourth D-type latch 208 and the output signal of the fifth D-type latch 210.

Referring to FIG. 3, a signal wave pattern of the phase detector 102a in FIG. 2 is shown. Let the enabling signal be a high level signal. The front edge of the first up signal UP1 will vary with the front edge or the rear edge of the data signal DT. When the front edge of or the rear edge of the data signal DT is ahead of the rising edge or the falling edge of the clock signal CLK, the average value of the phase error signal PE outputted by the charge pump 104 will rise up, so as to increase the frequency and fasten the phase of the clock signal outputted by VCO 108. To the contrary, when the front edge of or the rear edge of the data signal DT is behind the rising edge or the falling edge of the clock signal CLK, the average value of the phase error signal PE outputted by the charge pump 104 will fall down, so as to reduce the frequency of and lower the phase of the clock signal outputted by the VCO 108.

The pulse width of the first up signal UP1 of the conventional the phase detector 102 is between 0 to 1 period of the clock signal CLK, while the pulse width of the first down signal DN2, the second down signal DN3, and the second up signal UP4 is only 1/2 of the period of the clock signal CLK. When the data signal DT is close to be 1/2 period behind the clock signal CLK behind the clock signal CLK, the phase detector 102 is more likely to misinterpret that the data signal DT is ahead of the clock signal CLK and generate a large quantity of the pluses of the first up signal UP1 to fasten the phase of the clock signal CLK and increase the frequency of the clock signal CLK. Consequently, the phase-lock loop clock recovery system 100 may not be locked or may take a longer time to be locked. This situation is more likely to occur during the initial status. Therefore, the phase locking range of the conventional phase-lock loop clock recovery system 100 is limited to when the phase difference is between 180° to −180°.

Besides, when the level transition of the data signal DT concurs with the rising edge of the clock signal CLK, the conventional phase detector 102 might have unlock problem due to the divergence of the phase error signal PE. Referring to FIG. 4, a signal wave pattern of the phase detector 102a when the level transition of the data signal DT concurs with the rising edge of the clock signal CLK is shown. Under this circumstance of concurrence, the first XOR gate 212 might misinterpret the situation and make the first up signal UP1 generate pulses continuously. By doing so, the phase error signal PE will continue to rise up and diverge, preventing the conventional phase-lock loop clock recovery system 100 from being locked or resulting in a much longer locking time.

Apart from the above-mentioned problems, the conventional phase-lock loop clock recovery system 100 might change its precision level and cause errors due to the occurrence of jitters or noises. Referring to FIG. 5, another wave pattern of the conventional phase detector is shown. Given that the width of a pulse 502 of the data signal DT is smaller than the period of a clock signal CLK and that the rising edge of the pulse occurs when the clock signal CLK is at a high level, only the first up signal UP1 will correspondingly generate a pulse 504, but the first down signal DN2, the second down signal DN3 and the second up signal UP4 will not. Consequently, the direct current level of the phase error signal PE might be boosted further, which might cause unlock problem to the phase-lock loop clock recovery system 100 due to the divergence of the phase error signal PE.

Referring to FIG. 6, a third wave pattern of the conventional phase detector 102a is shown. Given that the falling edge 602A of a pulse 602 of the data signal DT occurs when the clock signal CLK is at a high level, that the distance between the rising edge of 604A of next pulse 604 of the data signal DT and the falling edge 602A is smaller than 1/2 period of the clock signal CLK, and that the rising edge 604A occurs when the clock signal CLK is at a low level, likewise, only the first up signal UP1 will correspondingly generate a pulse 606, but the first down signal DN2, the second down signal DN3 and the second up signal UP4 will not. Consequently, the direct current level of the phase error signal PE might be boosted further, which might cause unlock problem to the phase-lock loop clock recovery system 100 due to the divergence of the phase error signal PE.

SUMMARY OF THE INVENTION

It is therefore an object of the invention to provide a phase detector, which can effectively resolve the unlock problem in a conventional phase-lock loop clock recovery system due to the divergence of the phase error signal of the phase detector.

The invention achieves the above-identified object by providing a phase detector, which comprises a first latch to a sixth latch, a first logic gate, and a first SR-type latch to a fourth SR-type latch. Of which, the first latch, which has a first input end for receiving data signal, is enabled by the first level portion of the clock signal. The second latch, which has a second input end for receiving a signal outputted by the first latch, is enabled by the second level portion of the clock signal. The third latch, which has a third input end for receiving a signal outputted by the second latch, is enabled by the first level portion of the clock signal. The fourth latch, which has a fourth input end for receiving a signal outputted by the third latch, is enabled by the second level portion of the clock signal. The fifth latch, which has a fifth input end for receiving the signal outputted by the fourth latch, is enabled by the first level portion of the clock signal. The sixth latch, which has a sixth input end for receiving a signal outputted by the fifth latch, is enabled by the second level portion of the clock signal. The first logic gate is for processing the output signal of the second latch and the output signal of the third latch. The first SR-type latch has a first setting end and a first resetting end for respectively receiving a data signal and an output signal of the first logic gate, and outputting a first up signal. The second SR-type latch has a second setting end and a second resetting end for respectively receiving an output signal of the second latch and an output signal of the fourth latch, and outputting a first down signal. The third SR-type latch has a third setting end and a third resetting end for respectively receiving an output signal of the third latch and an output signal of the fifth latch, and outputting a second down signal.

The fourth SR-type latch has a fourth setting end and a fourth resetting end for respectively receiving an output signal of the fourth latch and an output signal of the sixth latch, and outputting a second up signal.

According to another object of the invention, a phase detector for detecting the phase difference between a data signal and a clock signal, and outputting a first up signal, a first down signal, a second down signal and a second up signal to a charge pump is provided. The charge pump is for correspondingly outputting a phase error signal, a clock signal, a data signal, a first up signal, a first down signal, a second down signal and a second up signal, wherein both the wave pattern of the second down signal and that of the second up signal have the pulse pattern of a first edge and a second edge. The phase detector comprises a first up signal generating circuit, a first down signal generating circuit, a second down signal generating circuit and a second up signal generating circuit. The first up signal generating circuit is for receiving a data signal and generating a first up signal. When the data signal generates a first edge, the first up signal also generates a first edge; afterwards, when the clock signal generates a second edge, the first up signal also generates a second edge. The first down signal generating circuit is for generating a first down signal. After the first up signal has generated a first edge, the first down signal will generate a first edge when the clock signal is generating a first edge, and the first down signal will generate a second edge after a period of the clock signal.

The second down signal generating circuit is for generating a second down signal. After the first down signal has generated a first edge, the second down signal will generate a first edge when the clock signal is generating a second edge, and the second down signal will generate a second edge after a period of the clock signal. The second up signal generating circuit is for generating a second up signal. After the second down signal has generated a first edge, the second up signal will generate a first edge when the clock signal is generating a first edge, and the second up signal will generate a second edge after a period of the clock signal.

Other objects, features, and advantages of the invention will become apparent from the following detailed description of the preferred but non-limiting embodiments. The following description is made with reference to the accompanying drawings.

DETAILED DESCRIPTION OF THE INVENTION

To overcome the unlock problem in conventional phase-lock loop clock recovery system due to the divergence of the phase error signal of the phase detector, in the invention, the pulse width of the first up signal UP1 of the phase detector is designed to be between 1/2 to 3/2 periods of the clock signal CLK, while the pulse width of the first down signal DN2', the second down signal DN3', and the second up signal UP4' is designed to be equal to the period of the clock signal CLK'. The pulse width of the first up signal UP1 varies with the difference between the data signal DT' and the falling edge of the pulse of the signal CLK'. Moreover, the falling edge of the pulse of the first up signal UP1' is aligned to the falling edge of the clock signal CLK', and is unrelated to the pulse of the data signal DT'.

Figure 2:
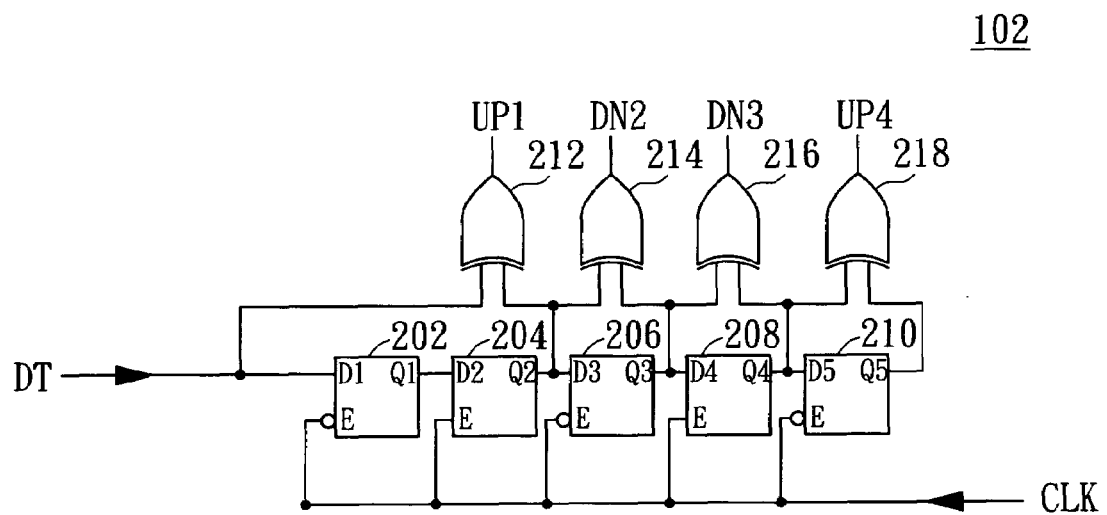
FIG. 2 is a detailed circuit diagram of a conventional phase detector.
Figure 3:
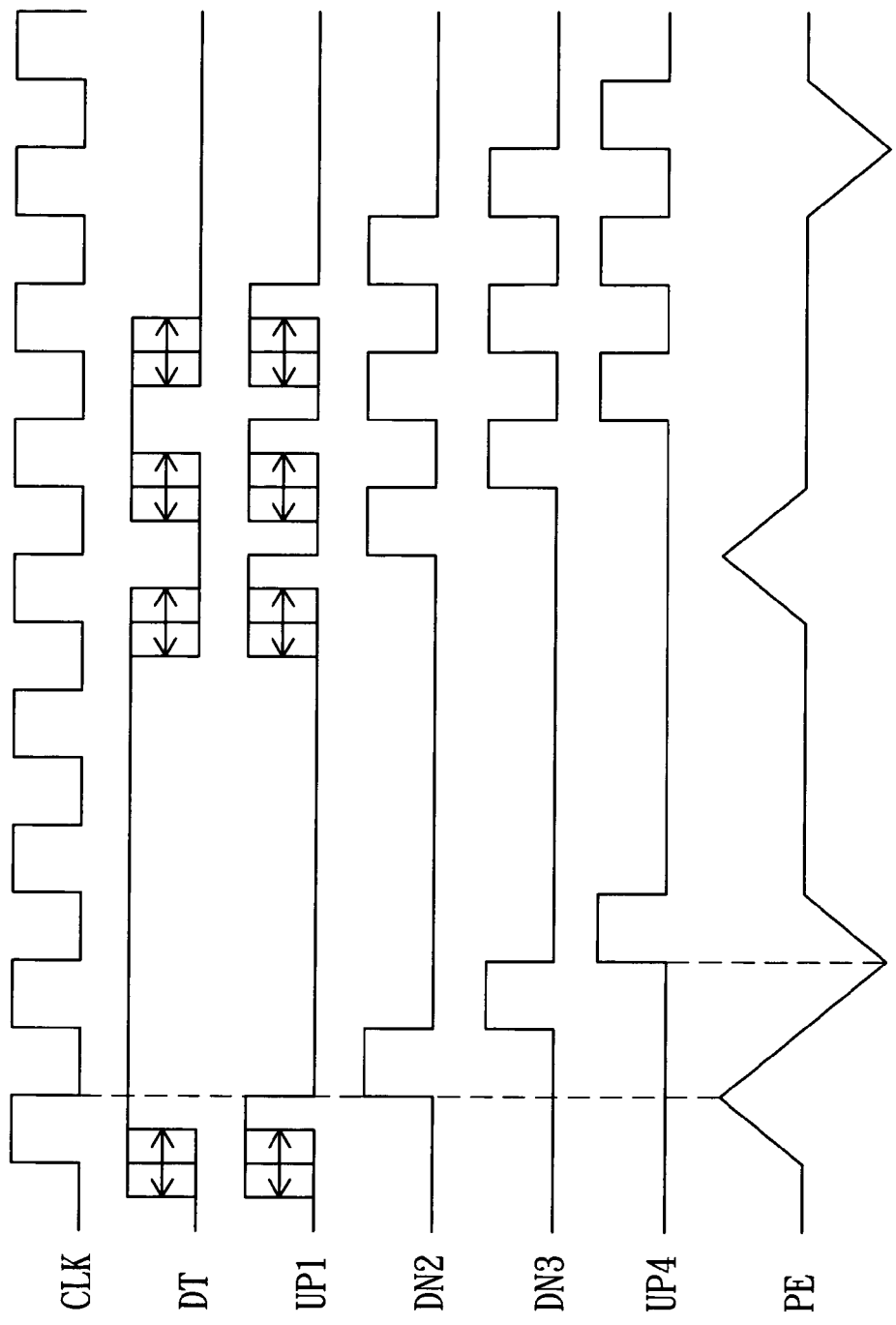
FIG. 3 is a signal wave pattern of the phase detector in FIG. 2.
Figure 4:
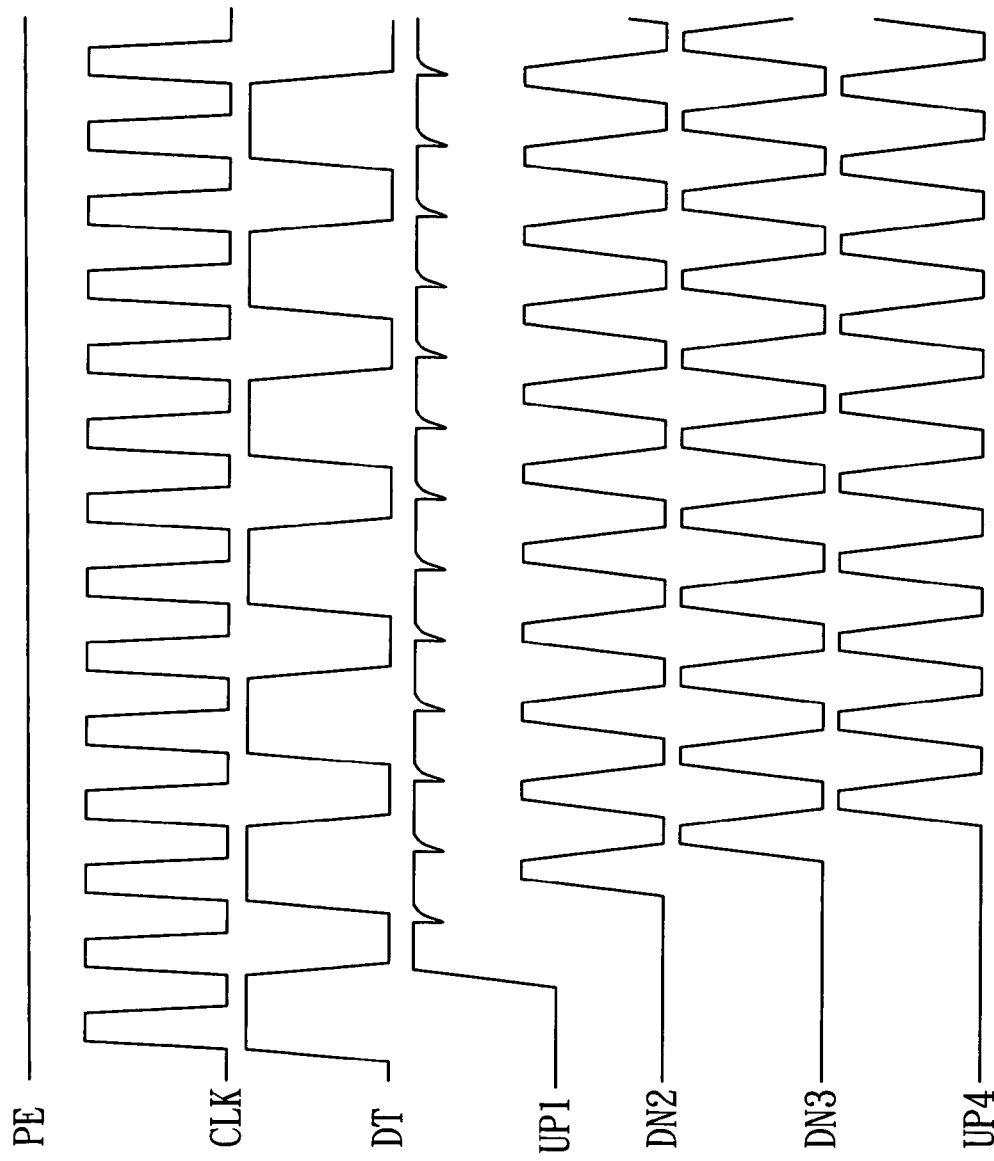
FIG. 4 is a signal wave pattern of the phase detector when the level transition of the data signal concurs with the rising edge of the clock signal.

The phase detector of the invention only detects either of the rising edge and the falling edge of the pulse of the data signal DT', and is different from the conventional phase detector shown in FIG. 2 which detects both of the rising edge and the falling edge of the pulse of the data signal DT at the same time. In the following preferred embodiment, the phase detector of the invention detects only the rising edge of the pulse of the data signal DT'. For the phase detector of the invention to detect only the falling edge of the pulse of the data signal DT', the data signal DT' has to pass a phase inverter first before being inputted to the phase detector of the invention.

Figure 1:
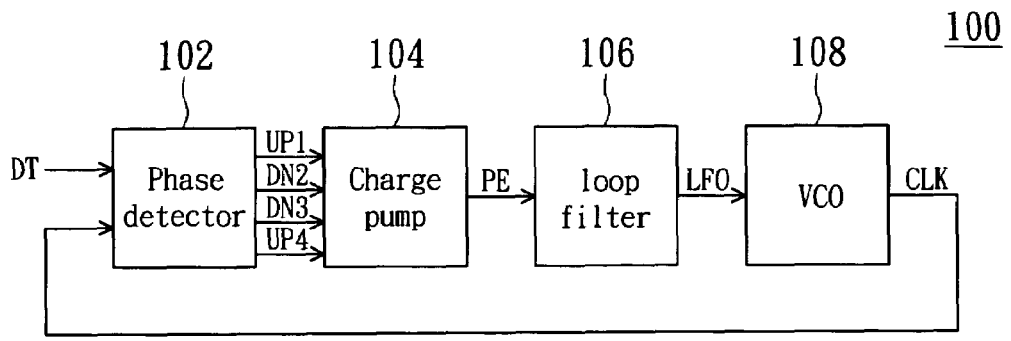
FIG. 1 is a block diagram of a conventional phase-lock loop clock recovery system.

The phase detector of the invention can be applied in a phase-lock loop clock recovery system. The phase-lock loop clock recovery system comprises a phase detector, a charge pump, a loop filter and a voltage controlled oscillator, denoted by different symbols as shown in FIG. 1. In the invention, the phase detector is for detecting the phase difference between the data signal DT' and the clock signal CLK', and correspondingly outputting a first up signal UP1', a first down signal DN2', a second down signal DN3' and a second up signal UP4' to the charge pump. The charge pump is for correspondingly outputting a phase error signal PE'. The loop filter is for receiving a phase error signal PE'. The voltage controlled oscillator is for receiving the output signal of the loop filter, and outputting a clock signal CLK'. Of which, the wave patterns of the clock signal CLK', the data signal DT', the first up signal UP1', the first down signal DN2', the second down signal DN3' and the second up signal UP4' all have a first edge (a rising edge for instance) and a second edge (a falling edge for instance). The clock signal CLK' has a first level portion (a low level portion for instance) and a second level portion (a high level portion for instance).

The charge pump has a capacitor and a plurality of current sources. When both the first up signal UP1' and the second up signal UP4' are enabled, the current sources will charge the capacitor to boost the voltage level of the phase error signal PE'. When both the first down signal DN2' and second down signal DN3' are enabled, the current sources will discharge the capacitor to lower the voltage level of the phase error signal PE'.

Preferred Embodiment One

Figure 7:
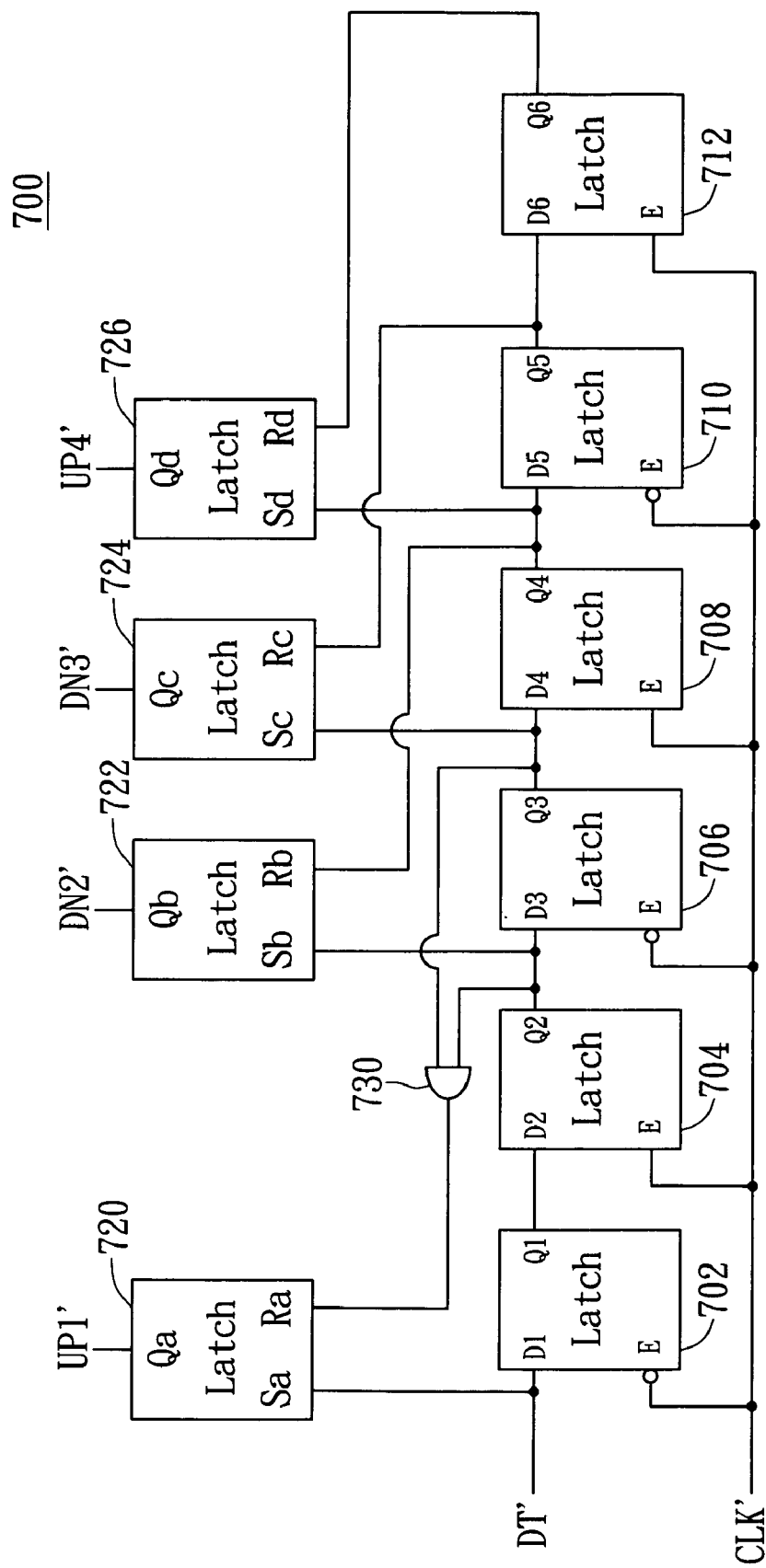
FIG. 7 is a circuit block diagram of the phase detector according to preferred embodiment one of the invention.

Referring to FIG. 7, a circuit block diagram of the phase detector according to a first embodiment of the invention is shown. In the invention, the phase detector 700 comprises a first latch 702, a second latch 704, a third latch 706, a fourth latch 708, a fifth latch 710, a sixth latch 712, a first logic gate, a first SR-type latch 720, a second SR-type latch 722, a third SR-type latch 724 and a fourth SR-type latch 726. Of which, the first, the second and the third latches 702, 704 and 706, the first logic gate 730 and the first SR-type latch 720 are assembled to form a first up signal generating circuit for receiving a data signal DT' and a clock signal CLK' to generate a first up signal UP1'. The first to the fourth latches 702 to 708 and the second SR-type latch 722 are assembled to form a first down signal generating circuit for receiving a data signal DT' and a clock signal CLK' to generate a first down signal DN2' as well. Similarly, the first to the fifth latches 702 to 710 and the third SR-type latch 724 are assembled to form a second down signal generating circuit for receiving a data signal DT' and a clock signal CLK' to generate a second down signal DN3'. The first to the sixth latches 702 to 712 and the fourth SR-type latch 726 are assembled to form a second up signal generating circuit also for receiving a data signal DT' and a clock signal CLK' to generate a first up signal UP4'. Of which, the first to the sixth latch 702 to 712 are all D-type latches, the first logic gate is an AND gate 730.

Each D-type latch has an input end D, an output end Q and an enabling end E. Each SR-type latch has a setting end S, a resetting end R and an output end Q. The clock signal CLK' is inputted to the enabling end E of each D-type latch to enable or disable the D-type latch. When the latch is enabled, the signal inputted via the input end D will be transmitted to output end Q immediately. When the latch is disabled, the output signal of the output end Q will maintain at the prior-enabling level. The true value table of the RS-type latch is shown in Table 1.

TABLE 1

| S | R | Q |
|---|---|---|
| 0 | 0 | Q |
| 0 | 1 | 0 |
| 1 | 0 | 1 |
| 1 | 1 | 0 |

The first latch 702, which has a first input end D1 for receiving a data signal DT', is enabled by the low level portion of the clock signal CLK'. The second latch 704, which has a second input end D2 for receiving an output signal of the first latch 702, is enabled by the high level portion of the clock signal CLK'. The third latch 706, which has a third input end D3 for receiving an output signal of the second latch 704, is enabled by the low level portion of the clock signal CLK'. The fourth latch 708, which has a fourth input end D4 for receiving an output signal of the third latch 706, is enabled by the high level portion of the clock signal CLK'. The fifth latch 710, which has a fifth input end D5 for receiving an output signal of the fourth latch 708, is enabled by the low level portion of the clock signal CLK'. The sixth latch 712, which has a sixth input end D6 for receiving an output signal of the fifth latch 710, is enabled by the high level portion of the clock signal CLK'.

The AND gate 730 is for possessing an AND operation of the output signal of the second latch 704 and the output signal of the third latch 706. The first SR-type latch 720 has a first setting end Sa and a first resetting end Ra for respectively receiving a data signal DT' and an output signal of the logic gate 730, and outputting a first up signal UP1'. The second SR-type latch 722 has a second setting end Sb and a second resetting end Rb for respectively receiving the output signal of the second latch 704 and the output signal of the fourth latch 708, and outputting a first down signal DN2'. The third SR-type latch 724 has a third setting end Sc and a third resetting end Rc for respectively receiving the output signal of the third latch 706 and the output signal of the fifth latch 710, and outputting a second down signal DN3'. The fourth SR-type latch 726 has a fourth setting end Sd and a fourth resetting end Rd for respectively receiving the output signal of the fourth latch 708 and the output signal of the sixth latch 712, and outputting a second up signal UP4'.

Figure 8:
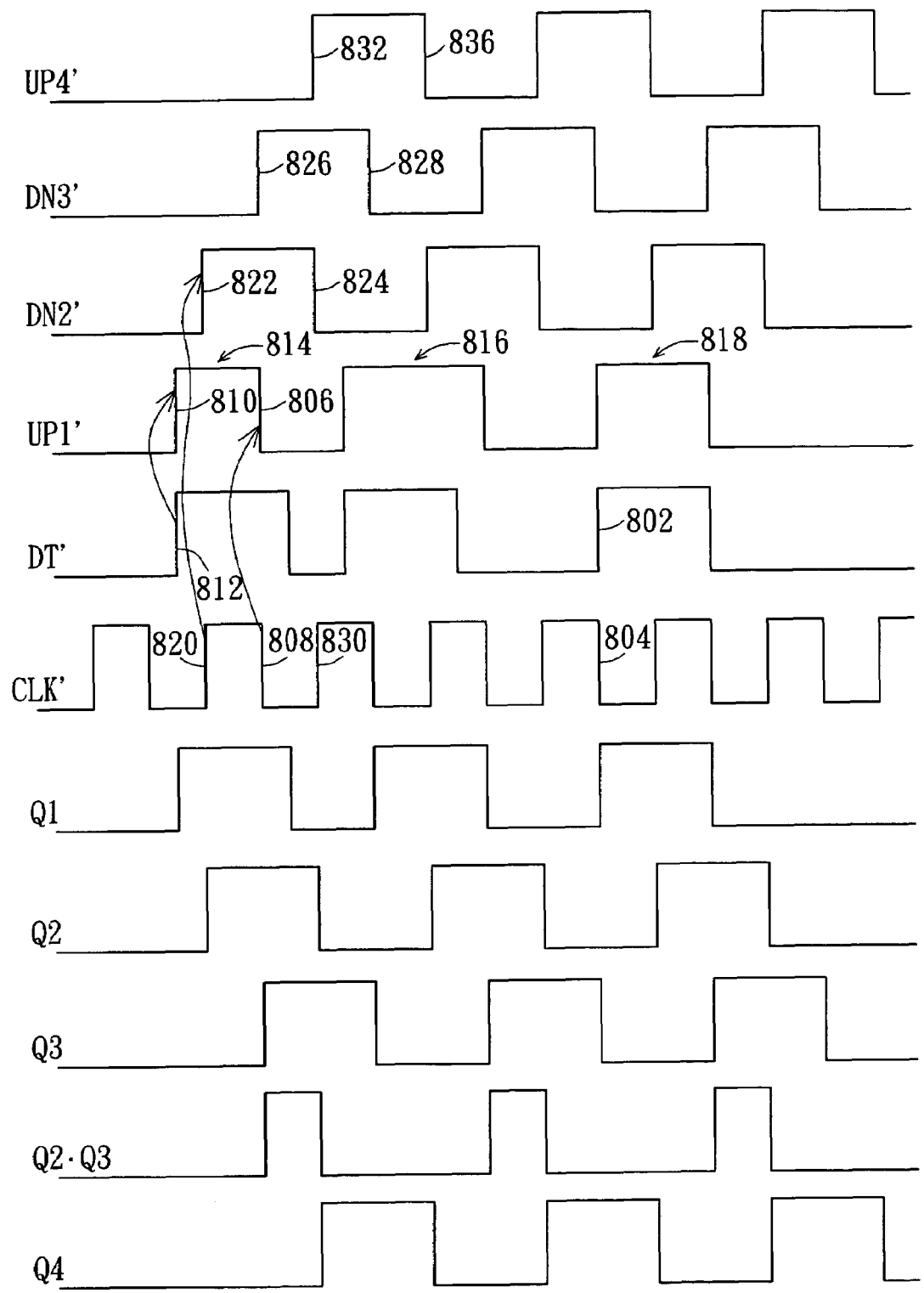
FIG. 8 is a signal wave pattern of the phase detector in FIG. 7 of the invention.

Referring to FIG. 8, a signal wave pattern of the phase detector in FIG. 7 of the invention is shown. Let signals Q1, Q2, Q3 and Q4 respectively represent the output signals of the first latch 702 to the fourth latch 708, and let signal Q2•Q3 represent the output signal of the AND gate 730. When a phase-lock loop clock recovery system like the one illustrated in FIG. 1 is locked, the invention will use the phase detector in FIG. 7 to lock the falling edge of the clock signal CLK' at the rising edge of the data signal DT'. As shown in FIG. 8, when the falling edge 804 of the clock signal CLK' and the rising edge 802 of data signal DT' occur at the same time, the phase-lock loop clock recovery system will be locked.

When the data signal DT' is generating a rising edge, the first up signal UP1' outputted by the first up signal generating circuit also generates a rising edge. Afterwards, when the clock signal CLK' is generating a falling edge, the first up signal UP1' also generates a falling edge. Given that the falling edge of the pulse of the first up signal UP1' is aligned to the falling edge of the clock signal CLK' (the falling edge 806 is aligned to the falling edge 808 for instance), and that the pulse of the rising edge of the first up signal UP1' is aligned to the rising edge of the data signal DT', for example, the rising edge 810 is aligned to the rising edge 812, the pulse width of the first up signal UP1' will vary with the difference between the rising edge of the data signal DT' and the falling edge of the clock signal CLK', say, the pulse s814, 816 and 818 for instance.

When the clock signal CLK' is generating a rising edge 820 after the first up signal UP1' has generated the rising edge 810, the first down signal DN2' outputted by the first down signal generating circuit mentioned above will generate a rising edge 822. The first down signal DN2' will generate a falling edge 824 after a clock signal CLK' period. When the clock signal CLK' is generating the falling edge 808 after the first down signal DN2' has generated the rising edge 822, the second down signal DN3' outputted by the second down signal generating circuit mentioned above will generate a rising edge 826. The second down signal DN3' will generate a falling edge 828 after a clock signal CLK' period. When the clock signal CLK' is generating a rising edge 830 after the second down signal DN3' has generated a rising edge 826, the second up signal UP4' outputted by the second up signal generating circuit mentioned above will generate a rising edge 832. The second up signal UP4' will generate a falling edge 836 after a clock signal CLK' period.

Figure 6:
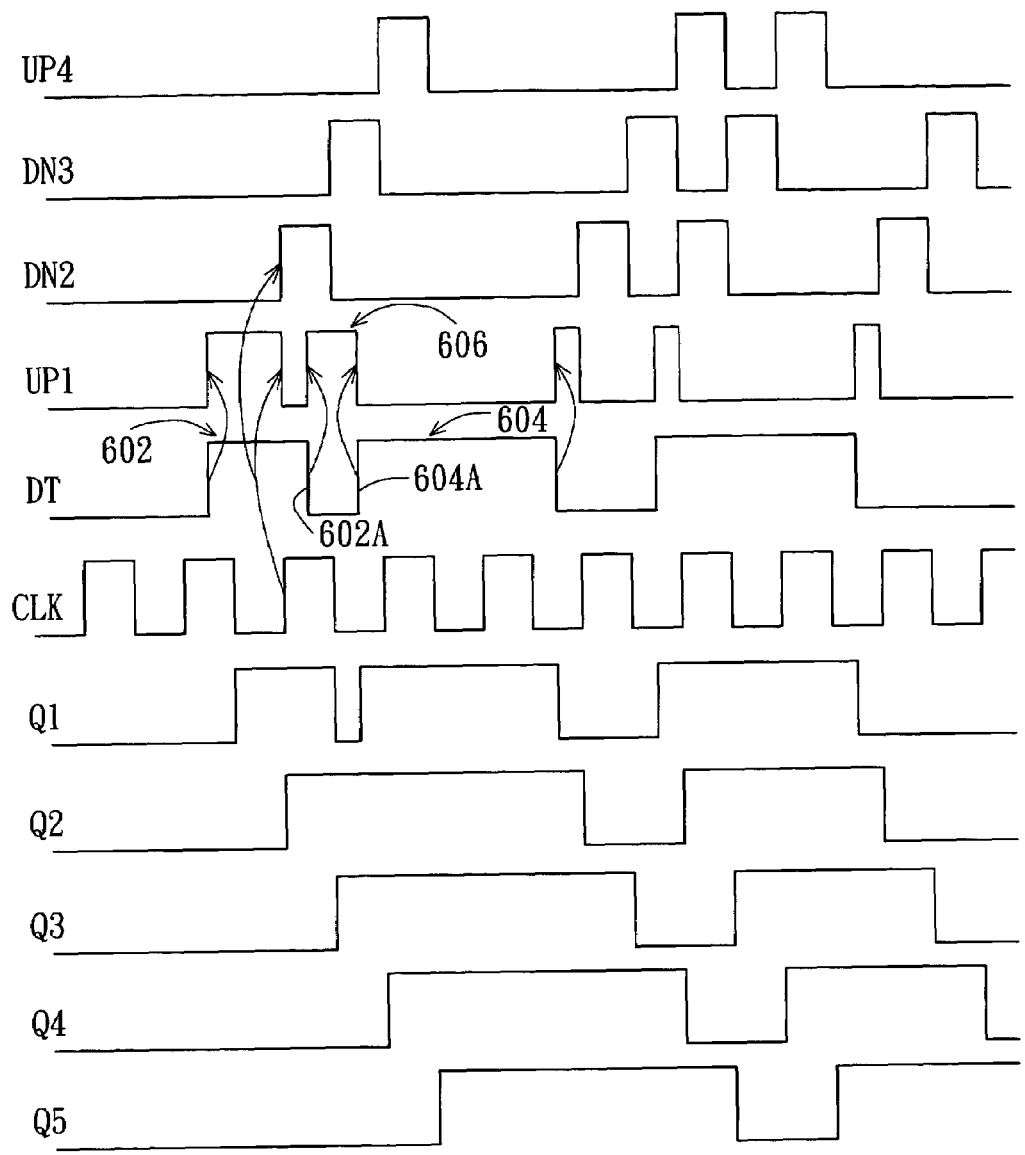
FIG. 6 is a third wave pattern of the conventional phase detector.
Figure 9:
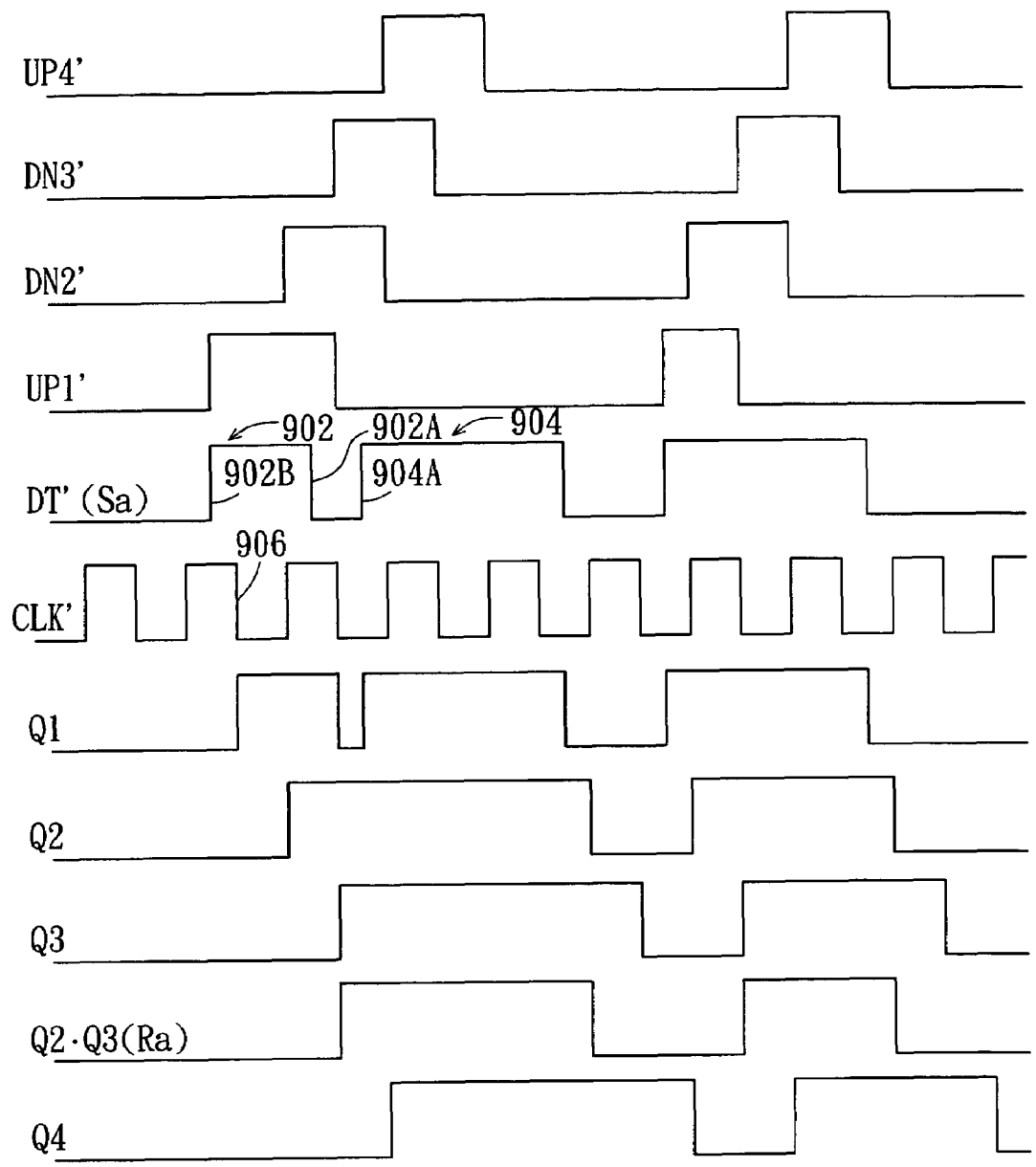
FIG. 9 is another signal wave pattern of the phase detector in FIG. 7 of the invention.

The phase detector 700 according to preferred embodiment one of the invention in FIG. 7 can resolve the divergence problem of the phase error signal PE of the conventional phase detector 102 in FIG. 6. Referring to FIG. 9, another signal wave pattern of the phase detector in FIG. 7 of the invention is shown. FIG. 9 illustrates the situations that the falling edge 902A of a pulse 902 of the data signal DT' occurs when the clock signal CLK' is at a high level, that the difference between the rising edge 904A and the falling edge 902A of a pulse 904 of the data signal DT' is smaller than 1/2 clock signal CLK' period, and that the rising edge 904A occurs when the clock signal CLK' is at a low level.

Judging from the operation theory of the phase detector 700 according to preferred embodiment one of the invention, the falling edge 906 of the clock signal CLK' should be locked at the rising edge 902B of the pulse 902 of the data signal DT' so as to widen the pulse width of the first up signal UP1'. However, since the interval between the falling edge 902A of the data signal DT' and the rising edge 904A is too short, such abnormal states are normally caused by jitters or noises. The phase detector 700 of the invention inputs a signal Q2•Q3 (an output signal of the signal AND gate 730) and a data signal DT' to a first setting end Sa and a first resetting end Ra of the first latch 720 respectively. According to the characteristics of the SR-type latch, when Sa=0 and Ra=1, UP1' maintains a 0 output, the rising edge 904A of the data signal DT' is neglected due to the rising edge 904A being occurred during the period when signal Q2•Q3 is in high level. Under such circumstances, the first up signal UP1'will not generate a pulse corresponding to the rising edge 904A to stabilize the phase error signal PE'. Compared with the conventional phase detector 102 which will still generate a pulse of the first up signal UP causing the phase error signal PE to float, the invention can effectively avoid the floating or divergence of the phase error signal PE so as to lock the phase-lock loop clock recovery system promptly.

Figure 5:
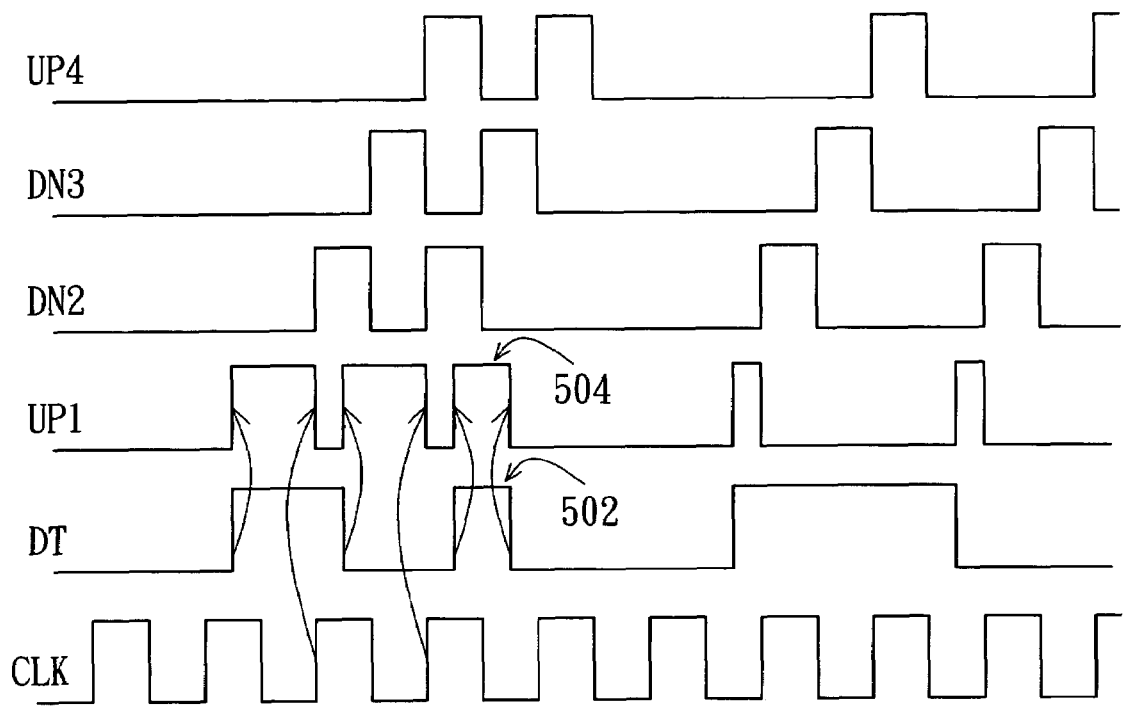
FIG. 5 is another wave pattern of the conventional phase detector.

To resolve another problem of the conventional phase detector 102 if FIG. 5, a compensating circuit can be added to the phase detector 700 according to preferred embodiment one, so as to obtain a phase detector disclosed in preferred embodiment two of the invention.

Preferred Embodiment Two

Figure 10:
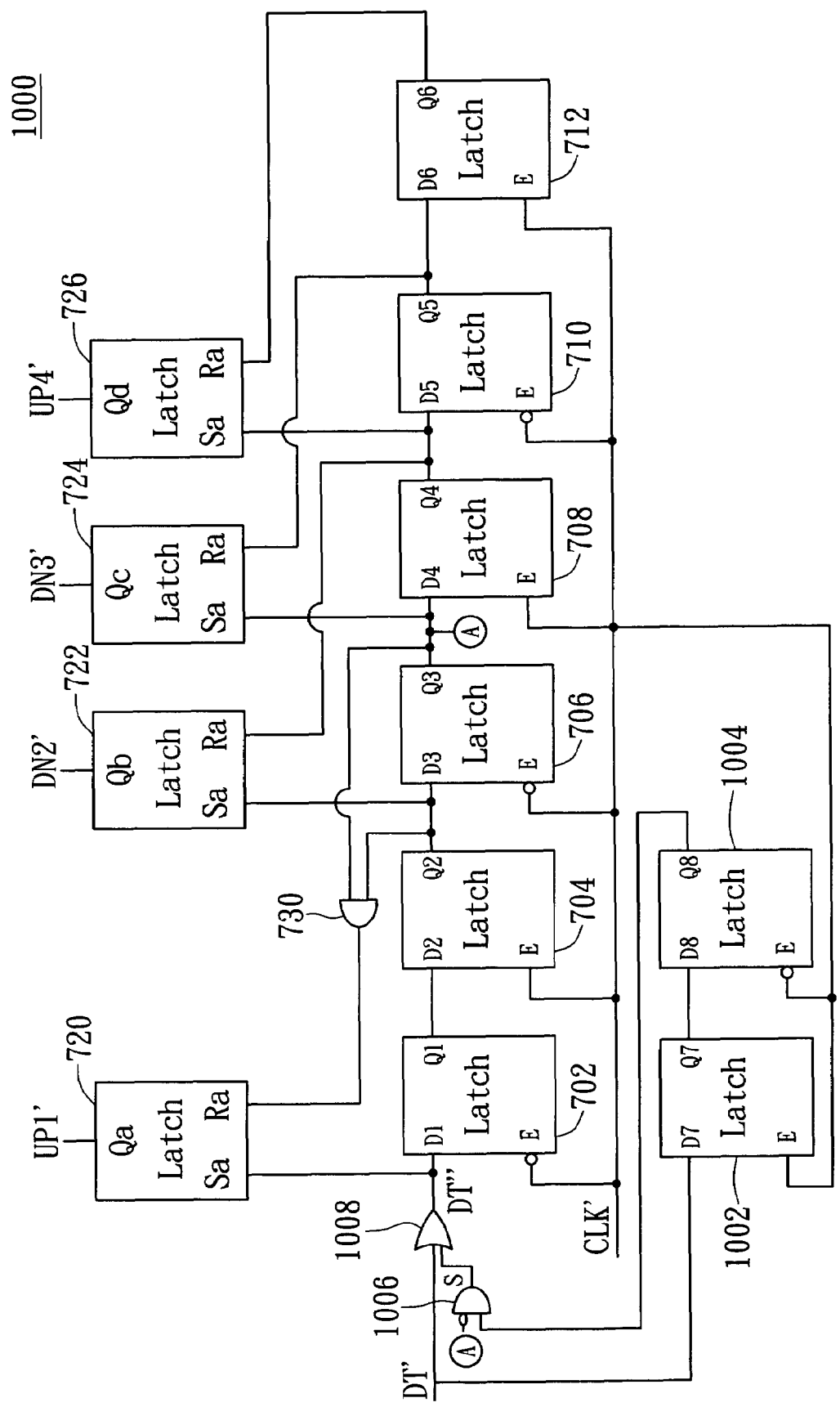
FIG. 10 a circuit block diagram of the phase detector according to preferred embodiment two of the invention.

Referring to FIG. 10, a circuit block diagram of the phase detector according to preferred embodiment two of the invention is shown. The difference between the phase detector 1000 in preferred embodiment two and the phase detector 700 in preferred embodiment one is that the first up signal generating circuit of the phase detector 1000 further has a compensating circuit, wherein the compensating circuit comprises a seventh latch 1002, an eighth latch 1004, an OR gate 1008 and a second logic gate. The second logic gate is an AND gate 1006.

The seventh latch 1002, which has a seventh input end D7 for receiving the data signal DT', is enabled by the high level portion of the clock signal CLK'. The eighth latch 1004, which has a eighth input end D8 for receiving an output signal of the seventh latch 1002, is enabled by the low level portion of the clock signal CLK'. The AND gate 1006 is for possessing an AND operation of the inverted signal of the output signal of the eighth latch 1004 and that of the third latch 706. Of which, the data signal DT' and the output signal S of the AND gate 1006 are inputted into the OR gate 1008, after the OR gate has possessed an OR operation of the inputted signals, a signal DT" is obtained and inputted into the first input end D1 of the first latch 702.

The signal DT" generated by the compensating circuit of the phase detector 1000 according to preferred embodiment two of the invention replaces the pulse of the data signal DT' and prolongs the pulse of the data signal DT', which is too short, via the OR operation of the output signal S and the data signal DT'. Then a longer pulse can be generated by the first up signal UP1', and corresponding pulse can be generated by the first down signal DN2', the second down signal DN3', and the second up signal UP4'. By doing so, the phase detector 1000 according to preferred embodiment two of the invention resolves the divergence problem of the phase error signal PE which might occur to conventional phase detector 102 in FIG. 5.

Figure 11:
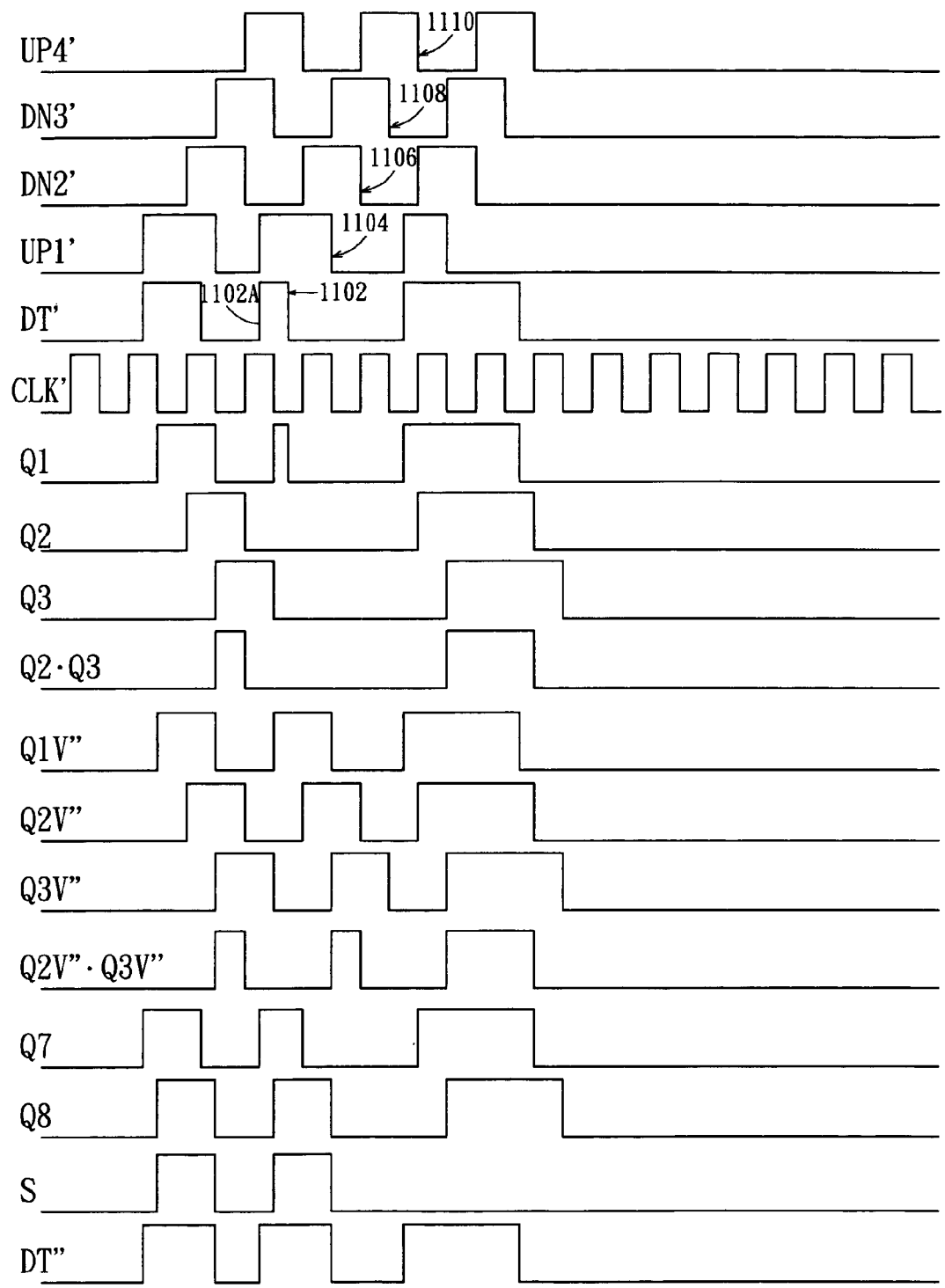
FIG. 11 is a signal wave pattern of the phase detector in FIG. 10 according to preferred embodiment two of the invention.

Referring to FIG. 11, a signal wave pattern of the phase detector in FIG. 10 according to preferred embodiment two of the invention. Signals Q1V', Q2V' and Q3V' represent the original output signals of the first, the second and the third latches 702, 704 and 706 without a compensating circuit; signals Q1V'', Q2V'' and Q3V'' represent the output signals of the first, the second and the third latches 702, 704 and 706 after a compensating circuit has been introduced to each of the first, the second and the third latches 702, 704 and 706. Q7 and Q8 represent the output signals of the seventh and the eighth latches 1002 and 1004. Given that the width of a pulse 1102 of the data signal DT' is smaller than a clock signal CLK' period and that the rising edge of 1102A of the pulse 1102 occurs when clock signal CLK' is at a high level, by means of the compensating circuit, the first up signal UP1' will correspondingly generate a pulse 1104 whose pulse width is wider than that of the pulse 1102 so that the first down signal DN2', the second down signal DN3' and the second up signal UP4' can generate corresponding pulses 1106, 1108 and 1110 respectively. Consequently, the unlock problem of the phase-lock loop clock recovery system due to the divergence of the phase error signal PE' can be avoided.

The advantages of the phase detector disclosed in the above preferred embodiment one and preferred embodiment two of the invention are listed below. First of all, the up signals UP1' and UP4' as well as the down signals DN2' and DN3' of the invention generate less pulses than the conventional phase detector 102 does, so the corresponding voltage changes of the phase error signal according to the invention is slower, more stable and is less likely to be affected by jitters and noises.

Next, compared with the conventional phase detector 102, which has a poor tolerance of jitters and is more likely to cause error to the up signals UP1 and UP4 as well as the down signals DN2 and DN3 as shown in FIG. 5 and FIG. 6, the phase detector according to the invention, which is more capable of processing jitters, avoids the level shifting and divergence of the phase error signal PE' and locks the phase-lock loop clock recovery system much promptly.

Besides, when the data signal DT' is demodulated at the receiving unit, non-balance of the rising edge and the falling edge of the data signal DT' often occurs due to manufacturing or external factors. In other words, the phase difference between the rising edge of the data signal DT' and the falling edge of the clock signal is not equal to the phase difference between the falling edge of the data signal DT' and the falling edge of the clock signal. Such an occurrence is a severe test to an ordinary phase detector. The phase detector, which chooses only either the rising edge of the falling edge of the data signal DT' for detecting the phase difference with the falling edge of the clock signal, will not be affected by the non-balance of the rising edge and the falling edge of the data signal DT' occurring when the pulse width of the data signal DT' is changed due to various factors.

Furthermore, the change rates of the up signals UP1' and UP4' as well as that of the down signals DN2' and DN3'of the phase detector according to the invention are slower than that of the conventional phase detector and requires a smaller capacitance and resistance than that of the conventional phase detector, so the circuit size can be further reduced.

Moreover, the pulse width of conventional up signals UP1 and UP4 as well as down signals DN2 and DN3 of the conventional phase detector is approximately 0 to 1 period of the clock signal. When the pulse width narrows, the pulse width, which is no longer related to the phase difference, is now affected by the rising edge and the falling edge of the data signal DT. Consequently, the pulse widths of the up signals UP1 and UP4 as well as the down signals DN2 and DN3 of the conventional phase detector are less balanced and more changeable. The pulse widths of the up signals UP1' and UP4' as well as the down signals DN2' and DN3' of the phase detector according to the invention are approximately 1/2 to 3/2 periods of the clock signal and are less affected by the rising edge and the falling edge of the data signal DT', wherein the pulse width of the up signals UP1' and UP4' according to the invention is closer to that of down signal DN2' and DN3' than that of the conventional phase detector. Besides, the up signals UP1' and UP4' as well as the down signals DN2' and DN3' of the phase detector according to the invention switch the voltage level less often than the conventional phase detector does, hence more energy saving.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A phase detector, comprising:
    a first latch, having a first input end for receiving a data signal and being enabled by a first level portion of a clock signal;
    a second latch, coupled to the first latch, having a second input end for receiving an output signal of the first latch and being enabled by a second level portion of a clock signal;
    a third latch, coupled to the second latch, having a third input end for receiving an output signal of the second latch and being enabled by the first level portion of the clock signal;
    a fourth latch, coupled to the third latch, having a fourth input end for receiving an output signal of the third latch and being enabled by the second level portion of the clock signal;
    a fifth latch, coupled to the fourth latch, having a fifth input end for receiving an output signal of the fourth latch and being enabled by the first level portion of the clock signal;
    a sixth latch, coupled to the fifth latch, having a sixth input end for receiving an output signal of the fifth latch and being enabled by the second level portion of the clock signal;
    a logic gate for processing a logic operation of the output signal of the second latch and the output signal of the third latch;
    a first SR-type latch, having a first setting end and a first resetting end for respectively receiving the data signal and an output signal of the logic gate, and for outputting a first up signal;
    a second SR-type latch, having a second setting end and a second resetting end for respectively receiving the output signal of the second latch and the output signal of the fourth latch, and for outputting a first down signal;
    a third SR-type latch, having a third setting end and a third resetting end for respectively receiving the output signal of the third latch and the output signal of the fifth latch, and for outputting a second down signal; and
    a fourth SR-type latch, having a fourth setting end and a fourth resetting end for respectively receiving the output signal of the fourth latch and the output signal of the sixth latch, and for outputting a second up signal.

2. The phase detector according to claim 1, wherein the first level portion is at a low level portion while the second level portion is at a high level portion.

3. The phase detector according to claim 1, wherein the first latch, the second latch, the third latch, the fourth latch, the fifth latch and the sixth latch are D-type latches.

4. The phase detector according to claim 1, wherein the first logic gate is an AND gate.

5. The phase detector according to claim 1, wherein the phase detector further comprises:
   a seventh latch, having a seventh input end for receiving the data signal and being enabled by the second level portion of the clock signal;
   an eighth latch, having an eighth input end for receiving an output signal of the seventh latch and being enabled by the first level portion of the clock signal;
   a second logic gate, for processing the output signal of the eighth latch and the inverted signal of the output signal of the third latch;
   an OR gate for receiving the data signal and the output signal of the second logic gate and generating a modified data signal so as to replace the first input end of the first latch to which the data signal is inputted and the first setting end of the first SR-type latch.

6. The phase detector according to claim 5, wherein the second logic gate is an AND gate.

7. A phase detector for detecting the phase difference between a data signal and a clock signal, and outputting a first up signal, a first down signal, a second down signal and a second up signal to a charge pump, the charge pump correspondingly outputting a phase error signal, the clock signal, the data signal, the first up signal, the first down signal, the second down signal and the second up signal having wave patterns of pulses with a first edge and a second edge, the phase detector comprises:
   a first up signal generating circuit for receiving the data signal and generating the first up signal, wherein the first up signal generates the first edge when the data signal is generating the first edge, and the first up signal will generate the second edge when the clock signal is generating the second edge afterwards;
   a first down signal generating circuit for generating a the first down signal, wherein after the first up signal has generated the first edge, the first down signal also generates the first edge when the clock signal is generating the first edge and the first down signal will generate the second edge after a period of the clock signal;
   a second down signal generating circuit for generating a the second down signal, after the first down signal has generated the first edge, the second down signal also generates the first edge when the clock signal is generating the second edge and the second down signal will generate the second edge after a period of the clock signal; and
   a second up signal generating circuit for generating a the second up signal, after the second down signal has generated the first edge, the second up signal also generates the first edge when the clock signal is generating the first edge and the second up signal will generate the second edge after a period of the clock signal.

8. The phase detector according to claim 7, wherein the first edge is a rising edge while the second edge is a falling edge.

* * * * *